United States Patent [19]

Chi et al.

[11] Patent Number: 5,075,749

[45] Date of Patent: Dec. 24, 1991

[54] OPTICAL DEVICE INCLUDING A GRATING

[75] Inventors: Gou-Chung Chi; James N. Hollenhorst, both of New Providence, N.J.; Robert A. Morgan, Topton, Pa.; Dirk J. Muehlner, Murray Hill, N.J.

[73] Assignee: AT&T Bell Laboratories, Murray Hill, N.J.

[21] Appl. No.: 680,612

[22] Filed: Apr. 1, 1991

Related U.S. Application Data

[63] Continuation of Ser. No. 459,169, Dec. 29, 1989, abandoned.

[51] Int. Cl.$^5$ ............................................. H01L 27/14
[52] U.S. Cl. ..................................... 357/30; 357/16; 357/59; 385/37
[58] Field of Search ..................... 357/59 R, 30 B, 16; 350/96.19, 96.11, 96.12, 96.13, 96.14

[56] References Cited

U.S. PATENT DOCUMENTS 4,038,606  7/1977  Hoeberechts et al. ............... 357/31
4,990,999  2/1991  Oishi et al. ........................... 357/71

FOREIGN PATENT DOCUMENTS 2071414  9/1981  United Kingdom .

OTHER PUBLICATIONS

"Grating enhanced quantum well detector," K. W. Goossen and S. A. Lyon, Appl. Phys. Lett. 47, Dec. 15, 1985, pp. 1257-1259.

"Strong 8.2 μm infrared intersubband absorption in doped GaAs/AlAs quantum well waveguides," B. F. Levine et al., Appl. Phys. Lett. 50, Feb. 2, 1987, pp. 273-275.

"Grating enhancement of quantum well detector response," K. W. Goossen and S. A. Lyon, Appl. Phys. Lett. 53, Sep. 19, 1988, pp. 1027-1029.

Primary Examiner—Andrew J. James
Assistant Examiner—Courtney A. Bowers
Attorney, Agent, or Firm—David I. Caplan

[57] ABSTRACT

Substrate-supported optical device structures such as, e.g., quantum-well infrared detectors/detector arrays are provided with a grating for optical coupling. Preferred gratings are formed in a nonepitaxial layer which, preferably, consists of a material which is different from underlying semiconductor material. Conveniently, a grating pattern is formed by etching, with the underlying material serving as an etch stop. For example, on a GaAs—AlGaAs device, polycrystalline silicon can be deposited and etched in this fashion.

21 Claims, 2 Drawing Sheets

OPTICAL DEVICE INCLUDING A GRATING

This application is a continuation of application Ser. No. 459,169, filed on Dec. 29, 1989, now abandoned.

CROSS REFERENCE TO RELATED APPLICATION

Filed of even date is a patent application designated as R. A. Morgan 2.

1. Technical Field

The invention is concerned with substrate-supported optical devices comprising a grating.

2. Background of the Invention

For the detection or modulation of optical radiation, especially at infrared frequencies, devices have been proposed based on intersubband or bound-to-continuum excitation of carriers in quantum wells as disclosed, respectively, in B. F. Levine et al., "Strong 8.2 μm Infrared Intersubband Absorption in Doped GaAs/AlAs", *Applied Physics Letters*, Vol. 50 (1987), pp. 273-275; and B. F. Levine et al., "High-detectivity $D^* = 1.0 \times 10^{10}$ cm $Hz^{-\frac{1}{2}}/W$ GaAs/AlGaAs Multiquantum Well $\lambda = 8.3$ μm Infrared Detector", *Applied Physics Letters*, Vol. 53 (1988), pp. 296-298.

Such devices include a substrate-supported layered structure forming quantum wells between barriers, and they can be conveniently implemented, e.g., by means of doped gallium arsenide well layers and aluminum-gallium arsenide barrier layers on a gallium-arsenide substrate. (By suitable choice of layer thickness and layer composition, devices can be made to have peak absorption at any desired wavelength in the "atmospheric window" region from 8 to 14 micrometers.) Resulting structures are considered suitable for use in, e.g., focal-plane arrays, high-speed detectors, optical heterodyne receivers, and vertically integrated long-wavelength infrared spectrometers.

Since, characteristically, responsivity of quantum-well detectors is dependent on the direction of incidence of radiation, with essentially zero response for incidence perpendicular to the layered structure, grating couplers have been proposed for oblique coupling of radiation. Relevant in this respect are the papers by K. W. Goossen et al., "Grating Enhanced Quantum Well Detector", *Applied Physics Letters*, Vol. 47 (1985), pp. 1257-1259; and K. W. Goossen et al., "Grating Enhancement of Quantum Well Detector Response", *Applied Physics Letters*, Vol. 53 (1988), pp. 1027-1029.

In the interest of ease of manufacture of devices of interest, and further in the interest of providing for a structure which is readily adaptable to device arrays, the invention as described below provides for a preferred grating arrangement, with preferred materials aspects.

SUMMARY OF THE INVENTION

Substrate-supported optical device structures comprising an epitaxially formed layer are provided with a grating for optical coupling. Preferred gratings comprise non-epitaxially formed material.

Especially when a grating is made by etching a grating pattern into a layer, preferred grating layer material is different from the underlying material, so that, conveniently, the underlying material may act as an etch stop. For example, on a GaAs-AlGaAs device, polycrystalline silicon can be formed and etched in this fashion.

DETAILED DESCRIPTION

Figure 1:
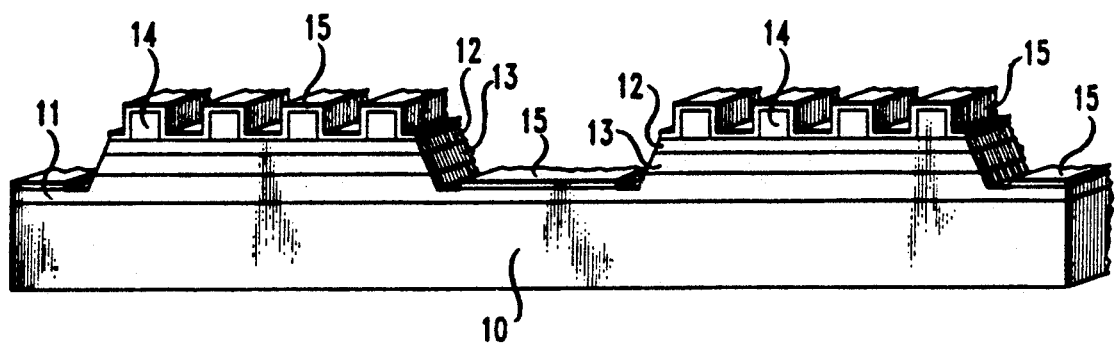
FIG. 1 is a schematic elevational view of a device comprising a plurality of optical detectors, equipped with gratings in accordance with a preferred embodiment of the invention.

FIG. 1 shows device structures 31 and 32, each comprising substrate 10 (consisting of semi-insulating gallium arsenide, for example), first and second contact layers 11 and 12 (consisting of heavily n-doped gallium arsenide, for example), layered structure 13 forming at least one quantum well (comprising gallium arsenide well layers and aluminum-gallium arsenide barrier layers, for example), grating structure 14 (consisting essentially of polycrystalline silicon, for example), and contacts 15 and 16 (consisting of germanium-gold alloy, for example). The structures 31 and 32 thus share portions of the substrate 10 and of the contact layer 11, but are thus otherwise physically separated. These structures 31 and 32 may thus be said to be "partially physically separated.

Figure 2:
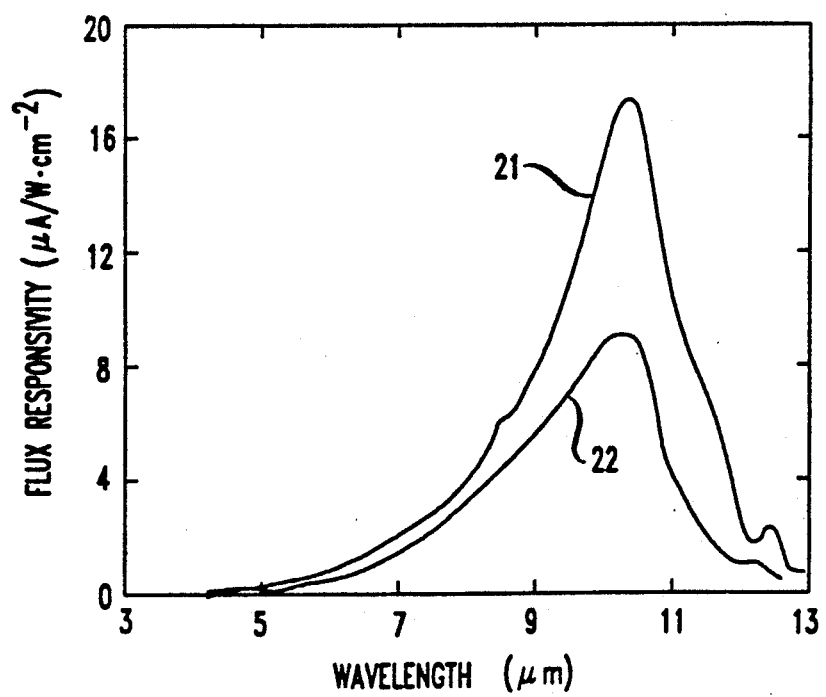
FIG. 2 is a diagram representing experimentally determined relationships between wavelength and radiation flux responsivity for a preferred device in accordance with the invention as compared with a prior-art device.

FIG. 2 shows curves 21 and 22, curve 21 corresponding to a preferred embodiment of the invention including a grating, and curve 22 corresponding to a prior-art device illuminated obliquely via a 45-degree beveled face in the substrate. The curves represent flux responsivity as a function of wavelength, determined with an 500 C. blackbody radiation source, at a detector temperature of 77K. Superior responsivity of a device including a grating is readily apparent upon comparison of curve 21 with curve 22.

Other than gallium arsenide, indium phosphide or other Group III-V materials can be used as device materials; and use of Group II-VI and Group IV materials is not precluded. For example, with respect to the latter, devices may be of a type as disclosed in U.S. Pat. No. 4,661,829, issued Apr. 28, 1987 to J. C. Bean et al., involving strained epitaxial germanium-silicon layers. More specifically contemplated in this respect is the use of an etched polycrystalline silicon layer as a grating on germanium. On Group-III-V materials, Group-IV gratings are preferred.

Grating design involves choice of material, grating layer thickness, and grating period. Preferred grating layer thickness is inversely related to the refractive index of the grating material, in accordance with the idealized relationship $$nh = \lambda/4,$$

where λ denotes a wavelength of interest, n denotes the refractive index of the grating layer material, and h denotes grating layer thickness. For example, with λ=10 micrometers, and n=3.4 (as for silicon), preferred grating layer thickness h is approximately 0.75 micrometer. In the interest of minimized grating layer thickness, high-index materials are preferred as grating materials. The efficacy of a grating may be enhanced also by suitable choice of an overlying material as, e.g., a contact metallization material.

Preferred period of the grating depends on the direction of radiation incidence and may be motivated by the desire for a first-order diffracted beam to propagate in a direction parallel to the layered structure. For example, in the case of perpendicular incidence, a preferred grating period is approximately $d = \lambda/n$.

Figure 3:
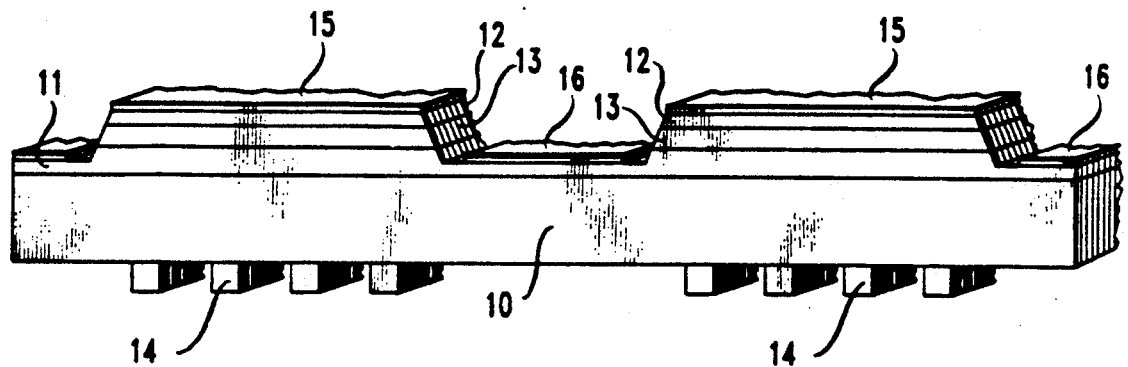
FIG. 3 is a schematic elevational view of a device comprising a plurality of optical detectors equipped with gratings in accordance with another embodiment of the invention.
Figure 4:
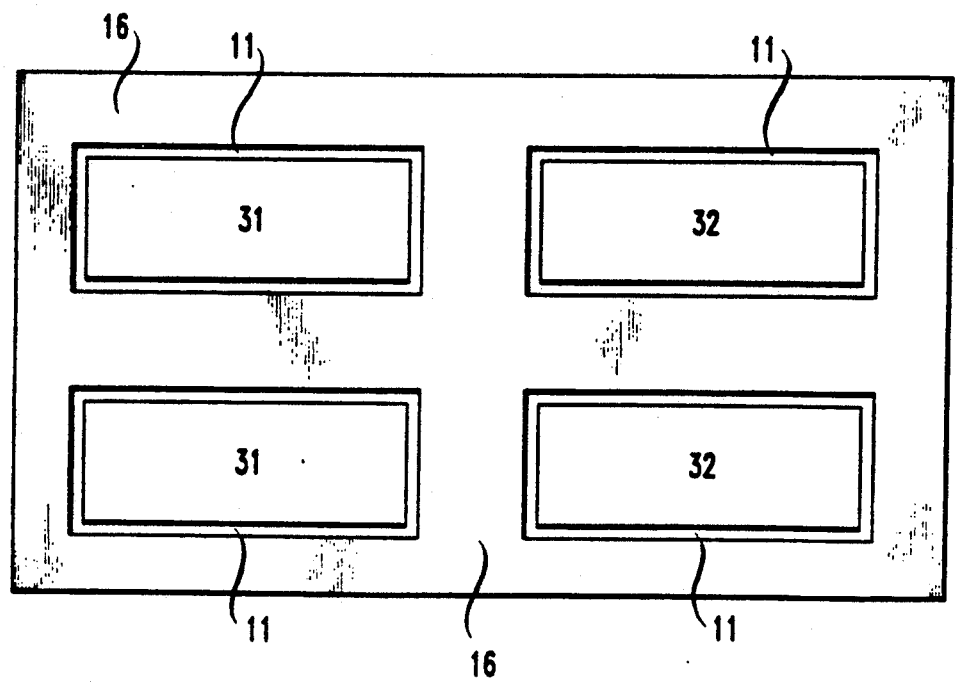
FIG. 4 is a top plan view of a device comprising a 2-dimensional array of optical detectors equipped with gratings in accordance with another embodiment of the invention.

As illustrated by FIG. 1, a grating may have rectangular profile and may be disposed on a deposited device structure. Among alternatives within the scope of the invention are triangular profiles, and application of a grating to the substrate. Also, gratings may be present on the device structure as well as on the substrate as indicated in FIG. 3. Preferred gratings can readily serve, e.g., to couple radiation into (2-dimensional) focal-plane detector arrays as indicated in FIG. 4.

Depending on specific choice of materials, the following are among benefits as may be realized by preferred embodiments of the invention:

(i) rapid, nonepitaxial deposition of preferred grating layer material,
(ii) high refractive index, and thermal matching of preferred grating layer material, and
(iii) reliance on material underlying a grating layer material to serve as an etch stop.

A device whose performance is illustrated in FIG. 2, curve 21 was made according to the following Example. Numerical values or nominal or approximate.

EXAMPLE

On a semi-insulating gallium arsenide substrate, a 1-micrometer first contact layer of gallium arsenide was deposited (doped $n = 2 \times 10^{18}$ cm$^{-3}$), followed by a detector structure consisting of 50 periods of 4-nanometer gallium arsenide quantum-well layers (doped $n = 2 \times 10^{18}$ cm$^{-3}$) between 30-nanometer $Al_{0.26}Ga_{0.74}As$ undoped barrier layers (resulting in a barrier height of approximately 250 meV). A second contact layer of 0.5 micrometer gallium arsenide was deposited, doped $n = 2 \times 10^{18}$ cm$^{-3}$. Layers as described above were deposited by molecular-beam epitaxy.

On the second contact layer a 750-nanometer layer of polysilicon was deposited by e-beam evaporation. A 4-micrometer-period grating was formed in the polysilicon layer by reactive-ion etching, with a photoresist layer as etch mask. The etching gas was approximately 95 percent $CF_4$ and 5 percent oxygen by volume. The second contact layer (underlying the polysilicon layer) was used as an etch stop. Scanning-electron-microscopic inspection showed that the grating had an essentially square profile, with a 1.9-micrometer/2.1-micrometer duty cycle.

After formation of the grating as described, a mesa structure having an approximate diameter of 250 micrometers was chemically etched in the presence of a photoresist mask. Metallic contact layers were deposited by sequential e-beam evaporation of germanium-gold (20 nanometers), silver (50 nanometers), and gold (75 nanometers) in the presence of a lift-off mask.

We claim:

1. A device comprising an epitaxial semiconductor layer located on a substrate,
   said device comprising optical diffraction grating means for coupling optical radiation, said optical diffraction grating means being located on said substrate or on said epitaxial layer or on both said substrate and said epitaxial layer,
   characterized in that the material of said semiconductor layer comprises a Group III-V material, and the material of said grating means comprises Group IV material.

2. The device of claim 1 in which an electric contact layer is located on said optical diffraction grating means.

3. The device of claim 1 in which said Group-IV material is silicon.

4. The device of claim 3 in which said silicon is polycrystalline.

5. The device of claim 1 in which the semiconductor layer comprises a quantum-well layer located between barrier layers.

6. The device of claim 1 in which the semiconductor layer comprises a plurality of layers forming a structure comprising quantum-well layers located between barrier layers.

7. The device of claim 1 in which the semiconductor layer comprises a plurality of partially physically separated epitaxial layered semiconductor structures.

8. The device of claim 7 in which said plurality of partially physically separated epitaxial layered semiconductor structures forms a 2-dimensional array.

9. An infrared radiation detector device comprising an epitaxial layered semiconductor structure on a substrate, said structure comprising gallium arsenide quantum-well layers and aluminum-gallium arsenide barrier layers,
   said structure being disposed between gallium arsenide contact layers with metallic contacts,
   said device comprising etched optical diffraction grating means for coupling optical radiation into said structure, said optical diffraction grating means being both located on said substrate or on an epitaxial layer supported by said substrate or an diffraction,
   the material of said optical grating means consisting essentially of polycrystalline silicon.

10. A device comprising an epitaxial semiconductor layer located on a substrate,
    said device comprising optical diffraction grating means for coupling optical radiation, said optical diffraction grating means being located on said substrate or on said epitaxial layer or on both said substrate and said epitaxial layer
    characterized in that the materials of said semiconductor layer and of said grating means comprise Group IV material.

11. The device of claim 10 in which the material of the grating means comprises silicon.

12. The device of claim 11 in which the material of semiconductor layer comprises germanium.

13. The device of claim 12 in which the semiconductor layer comprises a plurality of partially physically separated epitaxially layered structures that form a 2-dimensional array.

14. The device of claim 11 in which the semiconductor layer comprises a plurality of partially physically separated epitaxially layered structures that form a 2-dimensional array.

15. The device of claim 10 in which the semiconductor layer comprises a plurality of partially physically separated epitaxially layered structures that form a 2-dimensional array.

16. The device of claim 10 in which the material of the grating means comprises polycrystalline silicon.

17. The device of claim 16 in which the semiconductor layer comprises a plurality of partially physically separated epitaxially layered structures that form a 2-dimensional array.

18. The device of claim 16 in which the material of the semiconductor layer comprises germanium.

19. The device of claim 18 in which the semiconductor layer comprises a plurality of partially physically separated epitaxially layered structures that form a 2-dimensional array.

20. The device of claim 10 in which the material of the semiconductor layer comprises germanium.

21. The device of claim 20 in which the semiconductor layer comprises a plurality of partially physically separated epitaxially layered structures that form a 2-dimensional array.

* * * * *

UNITED STATES PATENT AND TRADEMARK OFFICE
CERTIFICATE OF CORRECTION

PATENT NO. : 5,075,749

DATED : December 24, 1991

INVENTOR(S) : Gou-Chung Chi, James N. Hollenhorst, Robert A. Morgan, Dirk J. Muehlner It is certified that error appears in the above-indentified patent and that said Letters Patent is hereby corrected as shown below:

Column 4, claim 9, line 43, delete "both".
Column 4, claim 9, line 44-45, "an diffraction" should read --on both--.
Column 4, claim 9, line 46, after "optical" insert --diffraction--.

Signed and Sealed this

Fourth Day of October, 1994

Attest:

BRUCE LEHMAN

Attesting Officer

Commissioner of Patents and Trademarks